(12) United States Patent
Chickermane et al.

(10) Patent No.: US 9,817,068 B1
(45) Date of Patent: Nov. 14, 2017

(54) METHOD AND SYSTEM FOR IMPROVING EFFICIENCY OF SEQUENTIAL TEST COMPRESSION USING OVERSCAN

(71) Applicant: Cadence Design Systems, Inc., San Jose, CA (US)

(72) Inventors: Vivek Chickermane, Slaterville Springs, NY (US); Krishna Vijaya Chakravadhanula, Vestal, NY (US); Brian Edward Foutz, Charlottesville, VA (US); Steev Wilcox, San Jose, CA (US); Paul Alexander Cunningham, Mountain View, CA (US); David George Scott, Endwell, NY (US); Louis Christopher Milano, Endwell, NY (US); Dale Edward Meehl, Melbourne, FL (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/754,386

(22) Filed: Jun. 29, 2015

(51) Int. Cl.
| | | |
|---|---|---|
| *G01R 31/3177* | (2006.01) |
| *G01R 31/3181* | (2006.01) |
| *G01R 31/3183* | (2006.01) |
| *G01R 31/3185* | (2006.01) |
| *G01R 31/319* | (2006.01) |

(52) U.S. Cl.
CPC ... *G01R 31/3177* (2013.01); *G01R 31/31813* (2013.01); *G01R 31/31921* (2013.01); *G01R 31/318335* (2013.01); *G01R 31/318547* (2013.01); *G01R 31/318544* (2013.01)

(58) Field of Classification Search
CPC .... G01R 31/318547; G01R 31/318335; G01R 31/31921; G01R 31/31813; G01R 31/318544
USPC .......................................................... 714/738
See application file for complete search history.

(56) References Cited

U.S. PATENT DOCUMENTS

| | | | | |
|---|---|---|---|---|
| 7,610,540 | B2* | 10/2009 | Balakrishnan ... | G01R 31/31921 703/13 |
| 7,647,540 | B2* | 1/2010 | Rajski ............ | G01R 31/318335 703/14 |
| 7,823,034 | B2* | 10/2010 | Wohl ............. | G01R 31/318547 714/726 |
| 7,840,865 | B2* | 11/2010 | Lai ................. | G01R 31/318547 714/728 |
| 7,930,607 | B2* | 4/2011 | Sinanoglu ...... | G01R 31/318335 714/729 |
| 8,479,067 | B2* | 7/2013 | Chandra ........ | G01R 31/318536 714/729 |
| 8,832,512 | B2* | 9/2014 | Czysz ............ | G01R 31/318536 714/738 |
| 8,887,018 | B2 | 11/2014 | Narayanan et al. | |

(Continued)

*Primary Examiner* — James C Kerveros
(74) *Attorney, Agent, or Firm* — Andrews Kurth Kenyon LLP

(57) ABSTRACT

Systems and methods efficiently bring additional variables into a Pseudo-Random Pattern Generator ("PRPG") in the early cycles of an automatic test pattern generation ("ATPG") process without utilizing any additional hardware or control pins. Overscanning (e.g., scanning longer than the length of the longest channel) for some additional cycles brings in enough variables into the PRPG. Data corresponding to earlier cycles of the ATPG process is removed.

12 Claims, 7 Drawing Sheets

(56) References Cited

U.S. PATENT DOCUMENTS

| | | | |
|---|---|---|---|
| 8,914,695 B2 * | 12/2014 | Gizdarski | G01R 31/318547 377/72 |
| 2010/0318863 A1 | 12/2010 | Whetsel | |
| 2010/0318866 A1 | 12/2010 | Whetsel | |
| 2012/0096324 A1 | 4/2012 | Whetsel | |
| 2012/0324305 A1 | 12/2012 | Whetsel | |
| 2015/0234009 A1 | 8/2015 | Whetsel | |
| 2015/0276871 A1 | 10/2015 | Ren et al. | |
| 2016/0169971 A1 | 6/2016 | Oomman et al. | |

* cited by examiner

FIG. 4A

Equations for Channel bits after running for 3 scan clock cycles

|  | | | | |
|---|---|---|---|---|
| Slice 3 | L3 + S21 + S12 + L4 + S11 | L4 + S11 + L3 + S21 + L1 | L3 + S21 + L1 + L2 + L4 + S22 | L3 + S21 + S12 + L2 + L4 + S22 |
| Slice 2 | L4 + S11 + L1 | L1 + L2 + L4 | L2 + L4 + L3 + S21 | L4 + S11 + L3 + S21 |
| Slice 1 | L1 + L2 | L2 + L3 | L3 + L4 | L4 + L1 |

FIG. 4B

PRPG state after 3 clock cycles

|  | | | | | |
|---|---|---|---|---|---|
| After cycle 3 | L2 + L4 + S22 + S13 | L3 + S21 + S12 | S11 + L2 + S22 | L3 + S21 + L1 + S23 | L3 + S21 + L4 + S22 |
| After cycle 2 | L3 + S21 + S12 | L4 + S11 | L3 + S21 + L1 | L2 + L4 | L3 + S21 |
| After cycle 1 | L4 + S11 | L1 | L2 + L4 | L3 | L4 |
| Initial State | L1 | L2 | L3 | L4 | |

FIG. 5A

Equations for Channel bits after running for 5 scan clock cycles

|  | | | | |
|---|---|---|---|---|
| Slice 3 | L3+S21+L1+S23+S14+L2+L4+S22+S13 | L2+L4+S22+S13+S12+L1+S23 | S12+L1+S23+S11+L2+S22+S24 | L3+S21+L1+S23+S14+S11+L2+S22+S24 |
| Slice 2 | L2+L4+S22+S13+L3+S21+S12 | L3+S21+S12+S11+L2+S22 | S11+L2+S22+L3+S21+L1+S23 | L2+L4+S22+S13+L3+S21+L1+S23 |
| Slice 1 | L3+S21+S12+L4+S11 | L4+S11+L3+S21+L1 | L3+S21+L1+L2+S22 | L3+S21+S12+L2+L4+S22 |
| Flushed out | L4+S11+L1 | L1+L2+L4 | L2+L4+L3+S21 | L4+S11+L3+S21 |
| Flushed out | L1+L2 | L2+L3 | L3+L4 | L4+L1 |

FIG. 5B

PRPG state after 5 clock cycles

|  | | | | |
|---|---|---|---|---|
| After cycle 5 | S11+L2+S22+S24+S23+S15 | L3+S21+L1+L2+S23+S14 | L4+S13+S11+S24 | S12+L1+S12+S23+S25 |
| After cycle 4 | L3+S21+L1+S23+S14 | L2+L4+S22+S13 | S12+L1+S23 | S11+L2+S22+S24 |
| After cycle 3 | L2+L4+S22+S13 | L3+S21+S12 | S11+L2+S22 | L3+S21+L1+S23 |
| After cycle 2 | L3+S21+S12 | L4+S11 | L1 | L2+L4 |
| After cycle 1 | L4+S11 | L1 | L2 | L3 |
| Initial State | L1 | L2 | L3 | L4 |

METHOD AND SYSTEM FOR IMPROVING EFFICIENCY OF SEQUENTIAL TEST COMPRESSION USING OVERSCAN

CROSS-REFERENCE TO RELATED APPLICATIONS

This application is related to U.S. patent application Ser. No. 14/754,351, entitled "Method and System for Improving Efficiency of XOR-Based Test Compression Using an Embedded Serializer-Deserializer," U.S. patent application Ser. No. 14/737,331, entitled "Elastic Compression—Optimizing Tester Bandwidth with Compressed Test Stimuli Using Overscan and Variable Serialization" and U.S. patent application Ser. No. 14/754,403, entitled "Method and System for Construction of a Highly Efficient and Predictable Sequential Test Decompression Logic."

TECHNICAL FIELD

The present application relates to systems and methods for generating test patterns in testing integrated circuit designs.

BACKGROUND

Automatic test pattern generation ("ATPG") was developed to explicitly test each gate and path in an integrated circuit ("IC") design. As ICs have become larger and more complex, the amount of logic to be tested per input/output test pin has increased dramatically.

When an ATPG tool generates a scan test for a fault, or a set of faults, only a small percentage of scan cells in the scan channels need to take specific values (e.g., care bits). The rest of the cells in the scan channel are "don't care", and are usually filled with random values. Relatively few bits in an ATPG generated test pattern are "care" bits.

Test Compression takes advantage of the small number of significant values (care bits) to reduce test data and test time. However, as Test Compression decreases channel lengths, the number of specified bits (e.g., care bits) per time slice increases. There can be a large variance in the number of care bits across time slices.

XOR decompressors are also limited in that they are restricted to using only the scan data available in the same scan cycle. This leads to inefficiencies. For example, if the ATPG generated test only requires few care bits in a scan slice, then the rest of the scan data will remain unused.

Sequential decompressors overcome the above-discussed inefficiencies of the XOR decompressors by solving the linear equations of the entire test pattern simultaneously instead of slice-by-slice. Scan data is reused among multiple scan slices, so that scan data from scan slices having fewer care bits can be utilized in solving for scan slices with more care bits. The sequential decompressor network contains a linear feedback shift register ("LFSR") (also referred to as a Pseudo-Random Pattern Generator—PRPG) that receives data from a plurality of scan input signals and that sends its outputs through a linear spreader network of a plurality of XOR logic gates (e.g., an XOR decompressor). The outputs of the XOR decompressor, fed to scan channels, are a linear combination of the values from the PRPG starting state and the data inputted from a tester into the circuit through scan-input pins. The values outputted from the XOR decompressor lead to linear equations to determine the values to be sent into each scan channels. The PRPG was loaded with scan input variables before any values were shifted into the scan channels. However, this required that the channels be frozen while the scan input variables were being loaded into the PRPG (e.g., by holding the channels' clocks constant), which required an additional test control pin or other internal hardware to achieve.

Accordingly, there is a need for an efficient method of bringing additional variables into the PRPG in the early cycles of the ATPG process without utilizing any additional hardware or control pins.

BRIEF DESCRIPTION OF THE DRAWINGS

FIG. 4A illustrates the linear equations for the scan channel bits after the sequential decompressor of FIG. 3 runs for the length of the longest channel.

FIG. 4B illustrates the state of each bit in the PRPG of FIG. 3 after running the PRPG for the length of the longest channel.

FIG. 5A illustrates the linear equations for the scan channel bits after the sequential decompressor of FIG. 3 runs for longer than the length of the longest scan channel.

FIG. 5B illustrates the state of each bit in the PRPG of FIG. 3 after running for longer than the length of the longest scan channel.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods for efficiently bringing in additional variables into the PRPG in the early cycles of the ATPG process without utilizing any additional hardware or control pins. Accordingly, a method of overscanning (e.g., scanning longer than the length of the longest channel) for some additional cycles is provided to bring in enough variables into the PRPG.

According to an embodiment, a computer-implemented method for generating test patterns includes: receiving, at a linear feedback shift register, a plurality of scan input signals; updating bits in the linear feedback shift register using the plurality of scan input signals, each bit of the linear feedback shift register being shifted at each shift cycle for a plurality of shift cycles, wherein the number of the plurality of shift cycles is greater than a length of a longest scan channel of a set of scan channels by at least one; feeding a set of outputs from the linear feedback shift register to a spreading network of XOR logic gates; feeding a set of outputs from the spreading network to the set of scan channels, wherein the set of scan channels and each shift register of the linear feedback shift register are clocked at a same timing signal for the plurality of shift cycles; and removing the outputs from the spreading network at a set of earliest scan cycles of the set of scan channels, wherein the set of the earliest scan cycles corresponds to shift cycles in which fewer than all of the bits in the shift registers of the linear feedback shift register were updated using the plurality of scan input signals.

Figure 1:
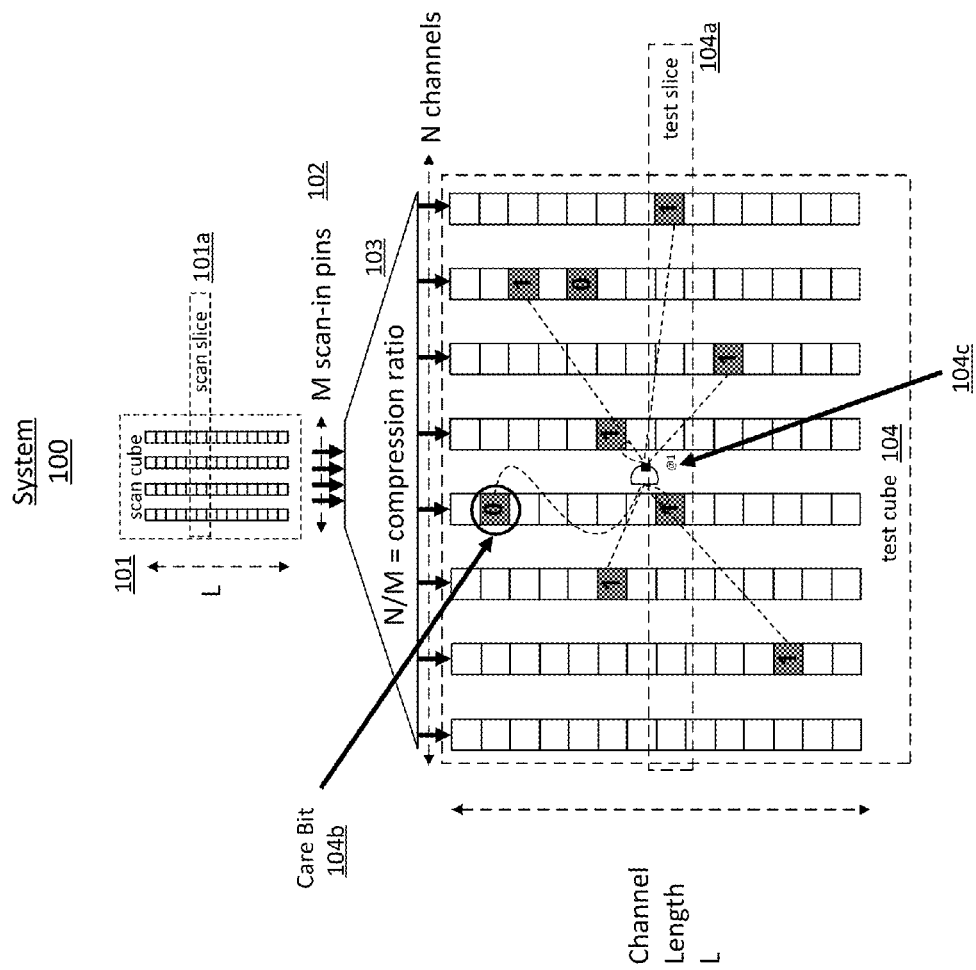
FIG. 1 illustrates elements of a system utilized during automatic test pattern generation.

FIG. 1 illustrates elements of a system 100 utilized during automatic test pattern generation. System 100, utilizing scan cube 101 (which includes one of many scan slices 101a), includes scan-in pins 102, decompressor 103, producing test cube 104 (which includes one of many test slices 104a, as well as care bits 104b, and an indication 104c of a faulty AND gate). In an embodiment, scan cube 101 is the generated test pattern that will be applied to a potential digital circuit in order to distinguish between proper circuit behavior and faulty circuit behavior caused by defects. Accordingly, in an embodiment, scan slice 101a will be applied to flip-flops associated with the location of scan slice 101a during the test of the digital circuit. In an embodiment, during the automatic test pattern generation process, care bits 104b are placed throughout the various test slices 104a of the scan channels of test cube 104 in order to test for faults. For example, in order to properly detect fault 104c, care bit 104b (as well as other care bits indicated by a binary value of either 1 or 0) are required to be placed in specified locations in the scan channels as illustrated in FIG. 1. In an embodiment, the fault to be tested for in the digital circuit is an AND gate which is stuck—at 1 (e.g., an individual pin is stuck at a logical '1'). Further, as depicted in FIG. 1, the compression ratio of decompressor 103 refers to the ratio of the number of the channels N to the number of the scan-in pins M.

In an embodiment, each scan cycle with care bits is solved one at a time from the earliest scan cycle with care bits (e.g., closer to the bottom of the test cube 104) to the last scan cycle with care bits (e.g., closer to the bottom of the decompressor 103), so that the ATPG process focuses on solving just the scan cycle of interest. Specifically, the equation solver solves for the variables (e.g., scan-in pin 102 inputs) necessary to generate the desired care bits (e.g., 104b) at each scan slice of the scan channels. Each channel input of the scan slice generally corresponds to a different Boolean combination (e.g., due to the decompressor 103) of the input bit variables (e.g., scan-in pin 102 inputs). Accordingly, each scan slice corresponds to a plurality of linear equations (e.g., ax=b). With the Boolean combinations provided by the decompressor 103 e.g., the "a") and the corresponding care bit values (e.g., the "b") for each of the scan channels of the scan cycle, the equation solver can solve for the desired scan input variables (e.g., the "x"). After the equation solver determines the desired scan input variables, the variables are extracted to a corresponding location in the scan pattern.

Figure 2:
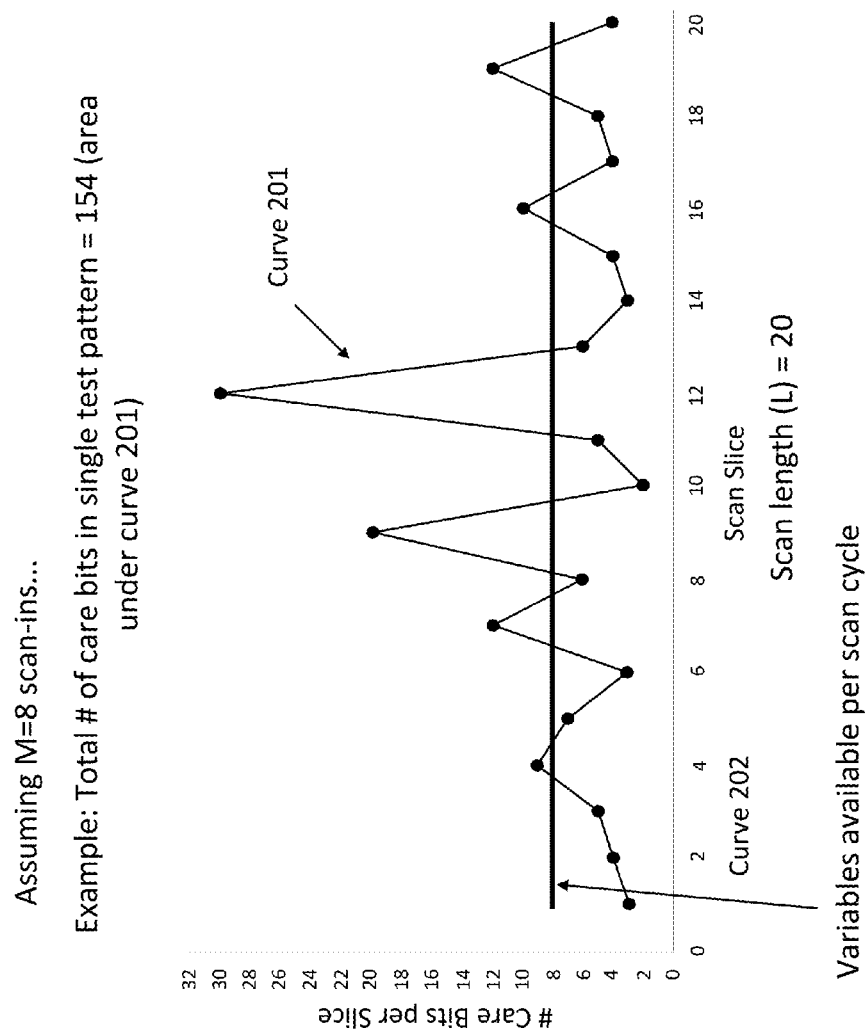
FIG. 2 is a graph depicting the total number of care bits that can be solved for, per scan slice, with a standard XOR decompressor.

FIG. 2 is a graph depicting the total number of care bits that can be solved for, per scan slice, with a standard XOR decompressor. For example, assuming 8 scan-in inputs, the XOR decompressor would shift in 8 variables every scan cycle (see curve 202). Accordingly, the equation solver can solve a maximum of 8 care bits per scan slice (e.g., 3 care bits or less is usually guaranteed). Thus, as depicted in FIG. 2, many scan slices with care bits exceeding 8 will not be solved (see curve 201). Specifically, with the XOR decompressor, many of the 154 care bits in the test pattern will not be solved. Further, as depicted in FIG. 2, the data volume (e.g., the product of the number of scan-in inputs M and the scan length L) of the XOR decompressor is 160 bits (e.g., area under curve 202).

Figure 3:
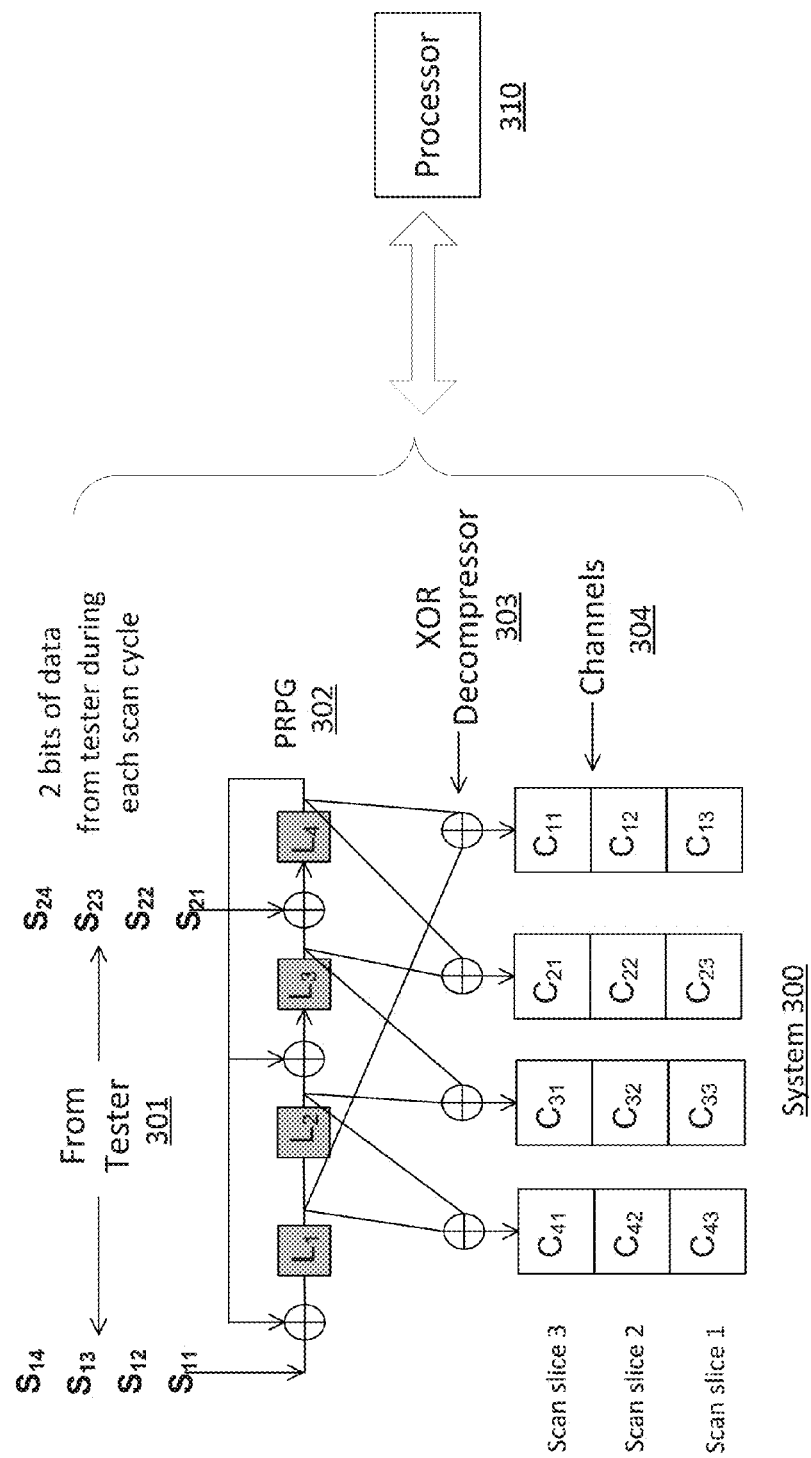
FIG. 3 illustrates elements of a sequential decompressor system.

FIG. 3 illustrates elements of a sequential decompressor system. System 300 includes input signals 301 from the tester, a LFSR 302 (also referred to as a PRPG), XOR decompressor 303 and scan channels 304. In an embodiment, two bits of data come in from the tester as input signals 301 for each scan cycle. For example, at the first scan cycle, $S_{11}$ and $S_{21}$ come in as input signals 301. In the next scan cycle, $S_{12}$ and $S_{22}$ come in as input signals 301, etc. Input signals 301 are input into PRPG 302 and shifted into shift registers of PRPG 302 for each scan cycle. Further, input signals 301 are XORed with the shifted values of PRPG 302 (including initial state values of the shift registers $L_1$, $L_2$, $L_3$ and $L_4$) for each scan cycle. In an embodiment, the outputs of the shift registers $L_1$, $L_2$, $L_3$ and $L_4$ are fed to an XOR decompressor 303. The output of XOR decompressor 303 is input to scan channels 304 at each scan cycle. In an embodiment, the system 300 interacts with a processor (or processing device) 310 in order to (i) input values into the scan channels and (ii) remove values from the scan channels associated with certain scan cycles.

FIG. 4A illustrates the linear equations for the scan channel bits after the sequential decompressor of FIG. 3 runs for the length of the longest channel. In other words, FIG. 4A illustrates the linear equations for the scan channel bits after the sequential decompressor of FIG. 3 runs for three clock cycles. As depicted in FIG. 4A, the initial scan slices (e.g., scan slice 1 and scan slice 2) have equations comprising of only the initial state values (e.g., $L_1$, $L_2$, $L_3$, and $L_4$) of the shift registers of the PRPG. Therefore, as there are no input variables (e.g., $S_{11}$ and $S_{21}$), any care bits in these bit positions will most likely not be solved.

FIG. 4B illustrates the state of each bit in the PRPG of FIG. 3 after running the PRPG for the length of the longest channel. Similar to FIG. 4A, the PRPG in FIG. 4B is run for three clock cycles. As depicted in FIG. 4B, after cycle 1, only shift registers $L_1$ and $L_4$ have equations including input variables. However, shift registers $L_1$ and $L_4$ only have equations including the initial state values of the PRPG 302. In fact, it takes three clock cycles for each of the shift registers (e.g., $L_1$, $L_2$, $L_3$, and $L_4$) to include input variables in their respective equations. Therefore, more than three clock cycles (e.g., the length of the longest channel) is required to prime PRPG 302 (e.g., update with values from input signals 301).

FIG. 5A illustrates the linear equations for the scan channel bits after the sequential decompressor of FIG. 3 runs for longer than the length of the longest scan channel. Specifically, FIG. 5A illustrates the linear equations for the scan channel bits after the sequential decompressor of FIG. 3 runs for five clock cycles. Therefore, the sequential decompressor of FIG. 3 overscans for an additional two cycles as compared with FIG. 4A. As depicted in FIG. 5A, after five clock cycles, the linear equations for the scan channel bits for the last three slices (e.g., the top three slices) all include input variables. Therefore, care bits corresponding to the bit positions in the top three slices will most likely be solved. In an embodiment, the shift registers of PRPG 302 and the scan channels 304 are clocked at the same timing signal. In other words, data is shifted down into the scan channels 304 while the PRPG 302 is being primed with the input variables. Accordingly, there is no need to freeze the clocks of the scan channels 304 while the PRPG 302 is being primed. Therefore, there is no need for additional hardware and/or control pins in order to prime the PRPG 302.

In an embodiment, as depicted in FIG. 5A, the earlier cycles (e.g., corresponding to channel bit equations with no input variables) are flushed out (e.g., removed). Specifically, as depicted in FIG. 5A, the earliest two cycles (e.g., the bottom two slices) are flushed out. Accordingly, the final channel content will include only the top three slices. In an embodiment, the earliest scan cycles are flushed out at the end of the scan process (e.g., after the equations for each channel bit of the scan channels all include input variables). In an embodiment, the lengths of each scan channel of the scan channels 304 could be different. Accordingly, in an embodiment, knowing the lengths of each scan channel of the scan channels 304 makes it possible to determine which scan slices of which channel to flush out at the end of the scan process. In an embodiment, the scan process can be overscanned by at least one clock cycle greater than the length of the longest scan channel. In another embodiment, the scan process can be overscanned at a clock cycle that is less than the number of PRPG bits divided by the number of scan-in inputs, meaning that the scan process is overscanned enough to prime the PRPG bits. Accordingly, the scan process of FIG. 4A only needs to be overscanned by two clock cycles (e.g., 4 PRPG bits divided by 2 scan-in inputs).

FIG. 5B illustrates the state of each bit in the PRPG of FIG. 3 after running for longer than the length of the longest scan channel. Similarly to FIG. 5A, the PRPG in FIG. 5B is run for five clock cycles. Further, as depicted in FIG. 5B, after clock cycle three, all of the shift registers of PRPG 302 are primed with input variables.

Figure 6:
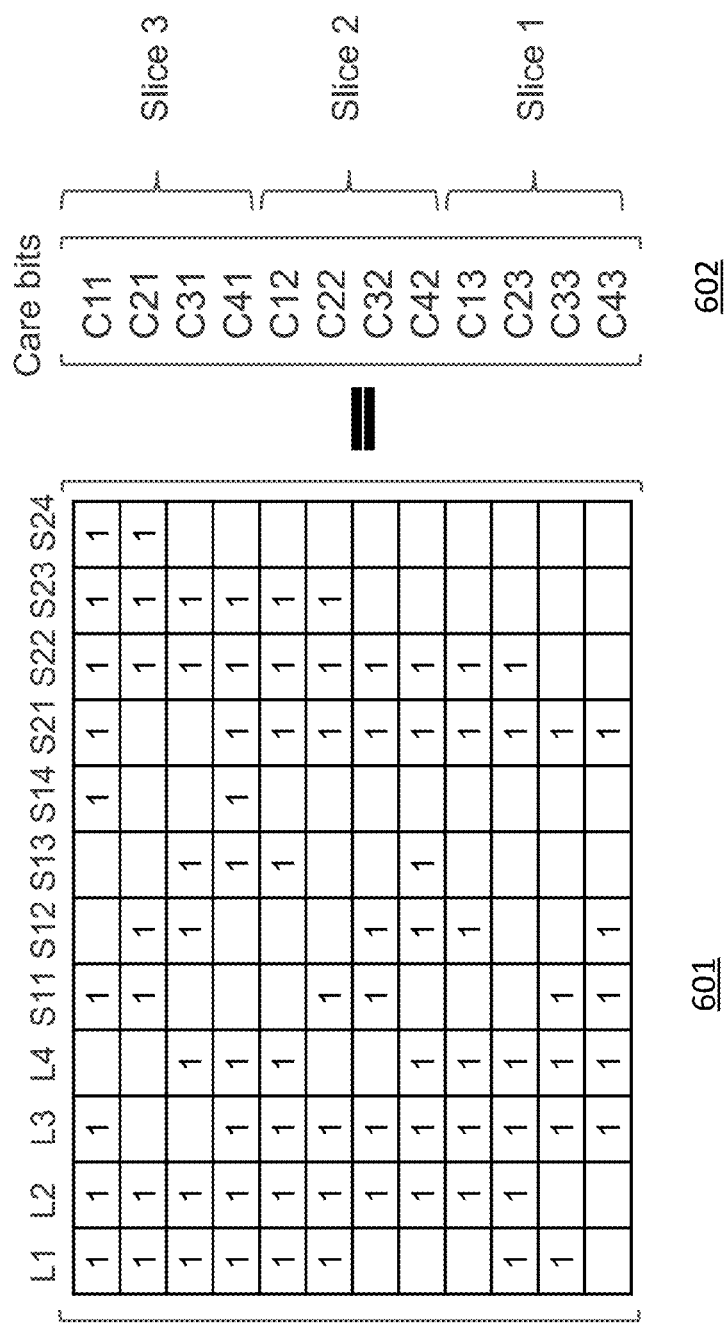
FIG. 6 depicts the system of linear equations for the sequential decompressor of FIG. 3.

FIG. 6 depicts the system of linear equations for the sequential decompressor of FIG. 3 after running the scan process for five clock cycles (e.g., overscanned). Matrix 601 depicts the linear equation for each of the channel bits in the test pattern. For example, the first row of matrix 601 corresponds to the linear equation for channel bit C11. Similarly, the second row of matrix 601 corresponds to the linear equation for channel bit C21, etc. Vertex 602 can be populated based on the care bits of the corresponding scan slices of the test pattern. In an embodiment, L1 to L4 can be removed from matrix 601 as they will most likely be zero. Accordingly, with matrix 601 (e.g., the "a" in ax=b) and vertex 602 (e.g., the "b" in ax=b) input variables $S_{11}$, $S_{12}$, $S_{13}$, $S_{14}$, $S_{21}$, $S_{22}$, $S_{23}$ and $S_{24}$ (e.g., the "x" in ax=b) can be determined for the entire test pattern.

Figure 7:
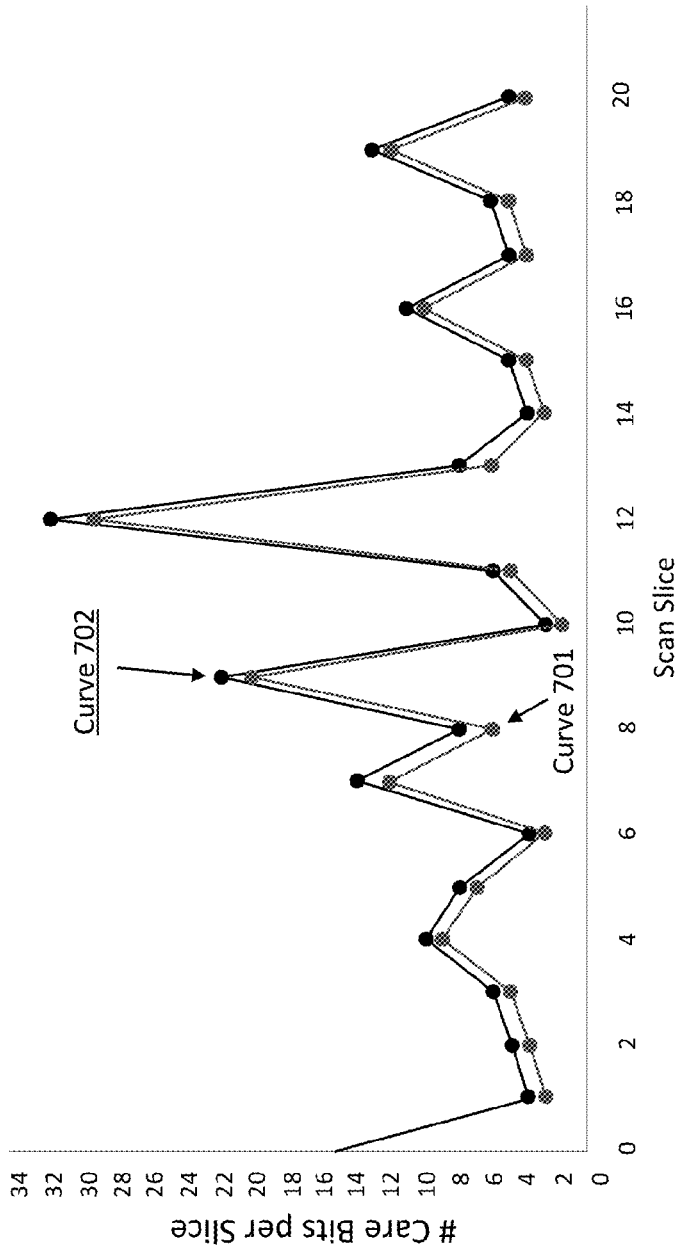
FIG. 7 is a graph depicting the total number of care bits that can be solved for in a test a pattern with the sequential decompressor utilizing overscan.

FIG. 7 is a graph depicting the total number of care bits that can be solved for in a test pattern with the sequential decompressor utilizing overscan. For example, assuming 8 scan-in inputs, the PRPG shifts in 8 variables every scan cycle. Further, as depicted by FIG. 7, the equation solver utilizes unused variables from sparse slices (e.g., lower number of care bits) to solve for the linear equation at dense slices (e.g., higher number of care bits) (see curve 702). Accordingly, the equation solver is able to solve for all of the 154 care bits in the test pattern. Further, as depicted by FIG. 7, the PRPG requires some number of overscan cycles to prime it with enough variables (see curve 702 between scan slice 0 and scan slice 1). Further, as depicted in FIG. 7, the data volume (e.g., the sum of the (i) overscan and (ii) the product of the number of scan-in inputs M and the scan length L) of the PRPG is 176 bits (e.g., area under curve 702). Accordingly, the equation can solve for any test cube distribution as long as it is under curve 702.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A computer-implemented method for generating test patterns, the method comprising:
    receiving, at a linear feedback shift register, a plurality of scan input signals;
    updating bits in the linear feedback shift register using the plurality of scan input signals, each bit of the linear feedback shift register being shifted at each shift cycle for a plurality of shift cycles such that all of the bits in the linear feedback shift register are updated using the plurality of scan input signals, wherein a number of the plurality of shift cycles is greater than a number of scan channel bits of a longest scan channel, of a set of scan channels, by at least one;
    feeding a set of outputs from the linear feedback shift register to a spreading network of XOR logic gates;
    feeding a set of outputs from the spreading network to the set of scan channels, wherein the set of scan channels and each shift register of the linear feedback shift register are clocked at a same timing signal for the plurality of shift cycles; and removing the outputs from the spreading network at a set of earliest scan cycles of the set of scan channels, wherein the set of the earliest scan cycles corresponds to shift cycles in which fewer than all of the bits in the linear feedback shift register were updated using the plurality of scan input signals.

2. The computer-implemented method of claim 1, wherein, after each bit of the linear feedback shift register is shifted for a number of shift cycles corresponding to the number of scan channel bits of the longest scan channel, each bit is shifted for an additional number of shift cycles, wherein the additional number is less than: a total number of shift registers divided by a total number of scan input signals.

3. The computer-implemented method of claim 1, wherein each bit of the linear feedback shift register is at an initial state before it is updated.

4. The computer-implemented method of claim 1, wherein said removing is implemented based on the number of scan channel bits in each of the scan channels.

5. An automatic test pattern generation system, comprising:
   a linear feedback shift register receiving one or more scan inputs from a tester, wherein the linear feedback shift register updates bits in the linear feedback shift register using the plurality of scan input signals, each bit of the linear feedback shift register being shifted at each shift cycle for a plurality of shift cycles such that all of the bits in the linear feedback shift register are updated using the plurality of scan input signals, wherein the number of the plurality of shift cycles is greater than a number of scan channel bits of a longest scan channel, of a set of scan channels, by at least one;
   a spreading network of XOR logic gates, wherein the spreading network is configured to receive a set of outputs from the linear feedback shift register, wherein a set of outputs from the spreading network is output to a set of scan channels, wherein the set of scan channels and each shift register of the linear feedback shift register are clocked at a same timing signal for the plurality of shift cycles; and
   a processor configured to remove the outputs from the spreading network at a set of earliest scan cycles of the set of scan channels, wherein the set of the earliest scan cycles corresponds to shift cycles in which fewer than all of the bits in the linear feedback shift register were updated using the plurality of scan input signals.

6. The automatic test pattern generation system of claim 5, wherein, after each bit of the linear feedback shift register is shifted for a number of shift cycles corresponding to the number of scan channel bits of the longest scan channel, each bit is shifted for an additional number of shift cycles, wherein the additional number is less than a value equivalent to: a total number of shift registers divided by a total number of scan input signals.

7. The automatic test pattern generation system of claim 5, wherein each bit of the linear feedback shift register is at an initial state before it is updated.

8. The automatic test pattern generation system of claim 5, wherein the processor removes the outputs from the spreading network based on the number of scan channel bits in each of the scan channels.

9. A non-transitory computer readable medium containing program instructions for generating test patterns, wherein execution of the program instructions by one or more processors of a computer system causes one or more processors to carry out the steps of:
   receiving, at a linear feedback shift register, a plurality of scan input signals, updating bits in the linear feedback shift register using the plurality of scan input signals, each bit of the linear feedback shift register being shifted at each shift cycle for a plurality of shift cycles such that all of the bits in the linear feedback shift register are updated using the plurality of scan input signals, wherein the number of the plurality of shift cycles is greater than a number of scan channel bits of a longest scan channel, of a set of scan channels, by at least one;
   feeding a set of outputs from the linear feedback shift register to a spreading network of XOR logic gates;
   feeding a set of outputs from the spreading network to the set of scan channels, wherein the set of scan channels and each shift register of the linear feedback shift register are clocked at a same timing signal for the plurality of shift cycles; and
   removing the outputs from the spreading network at a set of earliest scan cycles of the set of scan channels, wherein the set of the earliest scan cycles corresponds to shift cycles in which fewer than all of the bits in the linear feedback shift register were updated using the plurality of scan input signals.

10. The non-transitory computer readable medium of claim 9, wherein, after each bit of the linear feedback shift register is shifted for a number of shift cycles corresponding to the number of scan channel bits of the longest scan channel, each bit is shifted for an additional number of shift cycles, wherein the additional number is less than a value equivalent to: a total number of shift registers divided by a total number of scan input signals.

11. The non-transitory computer readable medium of claim 9, wherein each bit of the linear feedback shift register is at an initial state before it is updated.

12. The non-transitory computer readable medium of claim 9, wherein said removing is implemented based on the number of scan channel bits in each of the scan channels.

\* \* \* \* \*